United States Patent [19]

Dorey et al.

[11] 3,768,009

[45] Oct. 23, 1973

[54] MARK-SPACE ANALOGUE TO DIGITAL CONVERTERS

[75] Inventors: Howard Anthony Dorey; Eric Metcalf, both of Farnborough, England

[73] Assignee: The Solartron Electronic Group Limited, Farnborough, England

[22] Filed: Oct. 16, 1970

[21] Appl. No.: 81,358

[30] Foreign Application Priority Data

Oct. 29, 1969 Great Britain .................. 53,058/69

[52] U.S. Cl. ........ 324/99 D, 324/111, 340/347 AD, 340/347 NT

[51] Int. Cl. ....................... G01r 17/06, H03k 13/02

[58] Field of Search ................ 324/99 R, 99 D, 111; 340/347 AD, 347 NT

[56] References Cited

UNITED STATES PATENTS 3,581,305 5/1971 Howlett ....................... 340/347 AD

*Primary Examiner*—Rudolph V. Rolinec
*Assistant Examiner*—Ernest F. Karlsen
*Attorney*—William R. Sherman, Steward F. Moore, Jerry M. Presson and Arnold, Roylance, Kruger and Durkee

[57] ABSTRACT

A mark space analogue to digital converter or digital voltmeter has an integrator whose output ramps up and down during one conversion cycle in response to a continuously applied input signal and an intermittently applied opposing reference signal. The reference signal is applied at predetermined intervals and removed each time the integrator output returns to a detection level. The ratio of the time the reference signal is applied to the total time is measured to provide a digital representation of the input signal magnitude. More rapid convergence of the digital output is achieved by programming the said intervals to form a decreasing sequence. Preferably each interval is half the preceding interval.

8 Claims, 2 Drawing Figures

INVENTORS
Howard Anthony Dorey
Eric Metcalf
BY
ATTORNEY

IMPROVEMENTS IN MARK-SPACE ANALOGUE TO DIGITAL CONVERTERS

This invention relates to mark-space analogue to digital converters, especially such converters when used in digital voltmeters. Analogue to digital converters of the type at present under consideration comprise an integrating and comparing circuit responsive to first and second electrical signals to provide a net integral output voltage, the first and second signals being applied during a conversion interval respectively continuously and under the control of a bistable switching device which is arranged to switch to a first state at predetermined times and to a second state when the output voltage reaches a predetermined level, called a detection level, and a counter arranged to count clock pulses during that proportion of the conversion interval when the bistable device is in one state. The output voltage ramps up and down as a result, and the ratio between the two signals is proportional to the ratio of the time the bistable circuit is in the one state to total time; hence the name mark-space converter.

Converters of this type are described in the specification of U.S. patent application Ser. No. 481,853, filed Aug. 23, 1965. A feature of these converters is that several cycles of operation, typically seven, may be necessary before the instrument settles to a steady state in which the proportionality mentioned above applies. The specification of British Pat. No. 1,200,773 describes a similar converter in which a detection level is varied to achieve more rapid convergence to the steady state.

The object of this invention is to achieve rapid convergence in a particularly simple manner which does not necessitate the employment of a varying detection level. Another object is to achieve convergence with cycles which get progressively shorter, whereby the total measurement time is reduced.

According to the present invention, a mark-space analogue to digital converter has a timing circuit which varies the intervals between successive ones of the predetermined times in accordance with a predetermined program during the conversion interval. The program can reduce the length of the intervals at least once during the course of a measurement. Preferably there is a progressive reduction throughout the measurement and a particularly convenient program involves binary weighted intervals as described below.

The first signal is preferably the input to be converted while the second signal is a reference signal, though these roles can be interchanged and neither need be a reference signal if it is merely required to determine the ratio between two signals. Ordinarily steady signals will be employed, though pulsed signals can be used, as is well known in some kinds of digital voltmeters.

Further description follows by way of example with reference to the accompanying drawings, in which.

Figure 1:
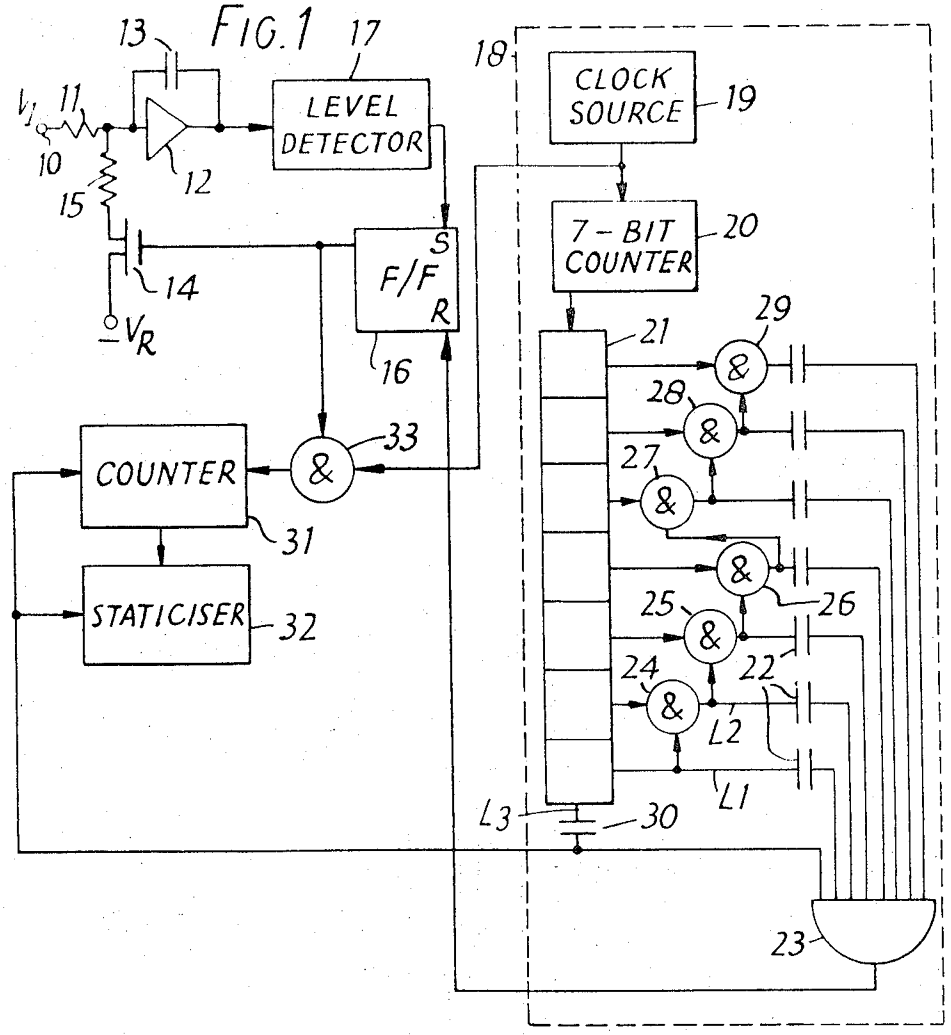
FIG. 1 is a block diagram of one embodiment.
Figure 2:
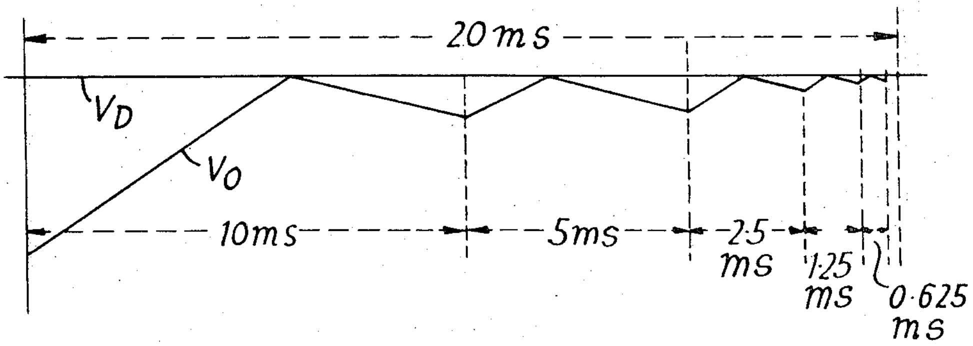
FIG. 2 shows explanatory waveforms.

In FIG. 1 an unknown voltage $V_I$ is applied to an input terminal 10 connected to an integrating circuit through an input resistor 11. The integrating circuit consists of an operational amplifier 12 with a feedback capacitor 13. An opposing reference voltage $-V_R$ is also applied through an FET switch 14 and a resistor 15 to the integrating circuit. The voltage $-V_R$ is applied when a bistable flip-flop 16 is in its reset state to close the switch 14, the flip-flop 16 being in the reset state at the beginning of the conversion or measurement interval. The current due to the reference voltage $-V_R$ is arranged to be greater than the full scale value due to $V_I$. Initially therefore the output voltage $V_o$ of the integrating amplifier 12 ramps up until it reaches a detection level $V_D$ established by a level detector 17. $V_o$ and $V_D$ are illustrated in FIG. 2. When $V_o$ reaches $V_D$, the level detector 17 sets the flip-flop 16 which opens the switch 14. $V_I$ now causes $V_o$ to ramp down until the flip-flop 16 is reset by a pulse from a timing circuit 18. The ramping up and down then repeats but the intervals at which the flip-flop 16 is reset become pressively shorter as illustrated in FIG. 2.

To this end the timing circuit 18 comprises a clock source 19, whose output pulses may have a frequency of 819.2 KHz and are counted down to define a 20ms measurement period by a seven-bit counter 20 and another seven-bit counter 21 whose most significant bit is at the bottom in FIG. 1, appearing on lead L1. The pulses from the counter 20 occur with a period of 0.15625ms and after the counter 21 has counted 64 of these, i.e. after 10ms, the state of the counter 21 is 1000000. The 0 to 1 transition of the most significant bit is used to feed a pulse on line L1 through a capacitor 22 and an OR gate 23 to reset the flip-flop 16. After another 32 of the 0.15625ms pulses, the counter 21 reads 1100000 and an AND gate 24 opens to pass a pulse on line L2 through another capacitor 22 to the OR gate 23. Further AND gates 25 to 29 detect the states 1110000, 1111000, 1111100, 1111110 and 1111111 and reset the flip-flop 16 via the OR gate 23 at the intervals shown in FIG. 2. At the right hand end of this Figure it has not been possible to show intervals of 0.3125ms, 0.15625ms and (again) 0.15625ms because of the smallness of the scale and equally the last part of $V_o$ is not shown. The last 0.15625ms interval is terminated by a pulse derived through a capacitor 30 from a line L3 signalling the 1 to 0 transition of the most significant bit of the counter 21. This pulse is applied to the OR gate 23 and is also used to mark the end of the 20ms measurement interval or cycle.

Thus the last-mentioned pulse also clears a counter 31 and transfers the contents to a readout staticizer 32. The counter 31 has accumulated undivided clock pulses during the intervals when the flip-flop 16 is reset, the flip-flop opening an AND gate 33 to pass these clock pulses. If the number of clock pulses counted in a measurement cycle is N, $V_I$ is proportional to N.

The error stored on the integrating capacitor 13 at the end of each reading can be made less than the resolution of the converter, and this state may be maintained during any period between readings. Thus the system requires substantially zero settling time before a reading. N can be read from the first cycle.

The converter may be arranged to switch a constant number of times or a small number of times compared with the number of pulses counted to reduce errors due to switching times.

A virtual earth amplifier has been described, but the well-known potentiometric forms may also be employed.

Furthermore, a voltmeter for converting inputs of one sign only has been described, but the circuit can be extended, in various ways well known per se, to handle inputs of either polarity.

The invention can be used in combination with that disclosed in British Pat. No. 1,200,773 if desired.

We claim:

1. An analog to digital converter, comprising integrating and comparing circuit means for responding to first and second electrical signals to provide a net integral output voltage, a bistable device, means for applying the first signal to said circuit means continuously through a conversion interval, means responsive to said bistable device for applying the second signal to said circuit means, means for switching said bistable device to a first state at predetermined times, means for switching said bistable device to a second state when the output voltage reaches a predetermined level, a source of clock pulses, counter means for counting clock pulses during that proportion of the conversion interval when the bistable device is in one of said states, and timing circuit means for varying the intervals between successive ones of the predetermined times in accordance with a predetermined program during the conversion interval.

2. A digital voltmeter, comprising integrating and comparing circuit means responsive to an input and a reference signal to provide a net integral output voltage, a bistable control device, means for applying the input signal to said circuit continuously throughout a conversion interval, means responsive to said bistable control device for applying the reference signal to said circuit means, means for switching said bistable device to a first state at predetermined times, means for switching the bistable device to a second state when the output voltage reaches a predetermined level, a source of clock pulses, a counter arranged to count clock pulses during that proportion of the conversion interval when the bistable device is in one of said states, and timing circuit means for reducing the interval between successive ones of the predetermined times at least once during the conversion interval.

3. A mark-space analog to digital converter according to claim 1, wherein the timing circuit reduces the length of the intervals at least once during the course of the conversion interval.

4. A mark-space analog to digital converter according to claim 1, wherein the timing circuit reduces the length of the intervals progressively throughout the course of the conversion interval.

5. A mark-space analog to digital converter according to claim 4, wherein the timing circuit reduces the intervals progressively by factors of two.

6. A mark-space analog to digital converter according to claim 5, wherein the timing circuit comprises a source of timing pulses, a binary counter arranged to count these pulses and means responsive to the states of the counter stages successively attaining the same value to switch the bistable to the first state.

7. A digital voltmeter according to claim 2, wherein the timing circuit reduces the length of the intervals progressively by factors of two throughout the course of the conversion interval.

8. A voltmeter according to claim 2 and further comprising means for transferring the value accumulated by said counter to a readout staticizer at the end of said conversion interval as a representation of the value of said first signal.

* * * * *